US011244800B2

(12) United States Patent
Platow et al.

(10) Patent No.: US 11,244,800 B2
(45) Date of Patent: Feb. 8, 2022

(54) STEPPED INDIRECTLY HEATED CATHODE WITH IMPROVED SHIELDING

(71) Applicant: Axcelis Technologies, Inc., Beverly, MA (US)

(72) Inventors: Wilhelm Platow, Newburyport, MA (US); Neil Bassom, Hamilton, MA (US); Shu Satoh, Byfield, MA (US); Paul Silverstein, Arlington, MA (US); Marvin Farley, Ipswich, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 17/330,801

(22) Filed: May 26, 2021

(65) Prior Publication Data

US 2021/0398765 A1 Dec. 23, 2021

Related U.S. Application Data

(60) Provisional application No. 63/040,724, filed on Jun. 18, 2020.

(51) Int. Cl.
*H01J 1/52* (2006.01)
*H01J 1/02* (2006.01)

(52) U.S. Cl.
CPC ............... *H01J 1/025* (2013.01); *H01J 1/52* (2013.01)

(58) Field of Classification Search
CPC .................................. H01J 1/52; H01J 1/025
See application file for complete search history.

(56) References Cited

U.S. PATENT DOCUMENTS

| 3,400,294 | A | 9/1968 | Kling | |
|---|---|---|---|---|
| 5,497,006 | A | 3/1996 | Sferlazzo | |
| 6,630,787 | B2 * | 10/2003 | Van Der Pol | H01M 10/0463 313/574 |
| 6,878,946 | B2 | 4/2005 | Farley | |
| 7,965,038 | B2 * | 6/2011 | Axelsson | H01J 61/0672 313/567 |
| 2004/0066128 | A1 | 4/2004 | Suguro | |
| 2006/0284104 | A1 | 12/2006 | Fujita | |
| 2017/0110282 | A1 * | 4/2017 | White | H01J 37/08 |

OTHER PUBLICATIONS

International Search Report and Written Opinion dated Sep. 17, 2021 in connection with PCT/US2021/037642.

* cited by examiner

*Primary Examiner* — Anne M Hines
(74) *Attorney, Agent, or Firm* — Eschweiler & Potashnik, LLC

(57) ABSTRACT

An ion source for forming a plasma has a cathode with a cavity and a cathode surface defining a cathode step. A filament is disposed within the cavity, and a cathode shield has a cathode shield surface at least partially encircling the cathode surface. A cathode gap is defined between the cathode surface and the cathode shield surface, where the cathode gap defines a tortured path for limiting travel of the plasma through the gap. The cathode surface can have a stepped cylindrical surface defined by a first cathode diameter and a second cathode diameter, where the first cathode diameter and second cathode diameter differ from one another to define the cathode step. The stepped cylindrical surface can be an exterior surface or an interior surface. The first and second cathode diameters can be concentric or axially offset.

21 Claims, 5 Drawing Sheets

STEPPED INDIRECTLY HEATED CATHODE WITH IMPROVED SHIELDING

REFERENCE TO RELATED APPLICATIONS

This application claims the benefit of U.S. Provisional Application Ser. No. 63/040,724 filed Jun. 18, 2020, the contents of all of which are herein incorporated by reference in their entirety.

TECHNICAL FIELD

The present invention relates generally to ion implantation systems, and more specifically to an improved ion source and beamline components that improve a lifetime, stability, and operation of various aspects of an ion implantation system.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Ion sources (commonly referred to as arc discharge ion sources) generate ion beams used in implanters and can include heated filament cathodes for creating ions that are shaped into an appropriate ion beam for wafer treatment. U.S. Pat. No. 5,497,006 to Sferlazzo et al., for example, discloses an ion source having a cathode supported by a base and positioned with respect to a gas confinement chamber for ejecting ionizing electrons into the gas confinement chamber. The cathode of the Sferlazzo et al. patent is a tubular conductive body having an endcap that partially extends into the gas confinement chamber.

FIG. 1 illustrates a cross section of a conventional ion source 10 used in a conventional ion implantation system. A filament 12 is resistively heated to a temperature at which thermionic emission of electrons occurs. A voltage (a so-called "cathode voltage") between the filament 12 and a cathode 14 accelerates the emitted electrons from the filament toward the cathode until the cathode, itself, thermally emits electrons. Such an emission scheme is termed in the industry as an indirectly heated cathode (IHC). The cathode 14, for example, serves two purposes; namely, it protects the filament 12 from being bombarded by plasma ions, and it provides electrons for subsequent ionization.

The cathode 14 is biased negatively with respect to an arc chamber 16 in which it resides as a so-called "arc voltage", and the emitted electrons are accelerated toward a center 18 of the arc chamber. A feed gas (not shown) is flowed into the arc chamber 16, and the emitted electrons subsequently ionize the feed gas, thus forming a plasma (not shown) from which ions can be extracted via an extraction slit 20 in the arc chamber. A repeller 22, for example, further charges up to the negative floating potential of the plasma and repels electrons back into the plasma, thus leading to enhanced ionization and a denser plasma. A magnetic field (not shown) that is parallel to a center axis 24 defined by the cathode 14 and repeller 22 generally confines the emitted and repelled electrons to define a so-called "plasma column", thus improving ionization and plasma density even further.

In general, the cathode 14, itself, fails first due to sputtering and erosion by plasma ions, and eventual permeation or punch-through of the cathode. This is especially true when tuning for multi-charge ion beams, which leads to significantly shorter lifetimes of the ion source when compared to singly-charged ions. The punch-through typically occurs where a wall 26 of the cathode is thinnest. FIG. 2 illustrates such a punch-through 28 at the wall 26 of the cathode 14, whereby the punch-through led to failure of the ion source even though there was sufficient material remaining at a front portion 30 of the cathode. When implanting multi-charged ions for high energy, such failures are commonplace in the ion source. Since elements such as arsenic (As) are very heavy, significant sputtering of the cathode 14 occurs. Further, for multi-charge ions, a substantially higher arc voltage is implemented, thus further decreasing a lifetime of the conventional ion source.

SUMMARY

The present disclosure thus provides a system and apparatus for increasing the efficiency and lifetime of an ion source. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one aspect of the disclosure, an ion source is provided for forming a plasma, whereby the ion source comprises a cathode and a cathode shield. The cathode, for example, comprises a cavity, whereby a filament is disposed within the cavity. The cathode further comprises a cathode surface defining a cathode step. The cathode shield, for example, has a cathode shield surface at least partially encircling the cathode surface, wherein a cathode gap is defined between the cathode surface and the cathode shield surface. The cathode gap, for example, defines a tortured path for the plasma to prolong a lifetime of the cathode.

According to one example, the cathode surface comprises a stepped cylindrical surface defined by a first cathode diameter and a second cathode diameter. The first cathode diameter and second cathode diameter, for example, differ from one another, therein defining the cathode step.

In one example, the stepped cylindrical surface comprises an exterior surface defining the first cathode diameter and second cathode diameter. The cathode shield surface can further define a cathode shield step, wherein a profile of the cathode shield step generally conforms to the cathode step, whereby the cathode gap between the cathode surface and the cathode shield surface is maintained. The second cathode diameter, for example, is greater than the first cathode diameter, and the second cathode shield diameter is greater than the first cathode shield diameter. The first cathode diameter and second cathode diameter can be concentric or be axially offset by a predetermined distance.

In another example, the stepped cylindrical surface of the cathode comprises an interior surface defining the first cathode diameter and second cathode diameter. The second cathode diameter, for example, is greater than the first cathode diameter, whereby a thickened wall of the cathode is defined. A filament gap, for example, may be further defined between the filament and the thickened wall of the cathode, where the thickened wall of the cathode generally increases a lifetime of the cathode.

The cathode, for example, comprises a hollow cylindrical portion extending from a solid cylindrical portion at a transition region, wherein the cavity is defined within the hollow cylindrical portion and wherein the cathode step is defined in the transition region. The cathode shield, in another example, radially surrounds the cathode while axially exposing a front cathode surface of the cathode to the plasma.

In accordance with another example aspect, an ion source is provided, wherein a cathode has a cathode step defined therein. A cathode shield has a cathode shield step defined therein, wherein the cathode shield radially surrounds the cathode while maintaining a cathode gap between the cathode and cathode shield. The cathode shield step, for example, generally conforms to the cathode step while maintaining the cathode gap, thus providing a tortured path for a plasma to travel.

The cathode, for example, comprises a hollow cylindrical portion extending from a solid cylindrical portion proximate to a transition region, wherein the cathode step is defined in the transition region. A filament, for example, can be disposed within the hollow cylindrical portion of the cathode. The cathode, for example, comprises a first cathode diameter and a second cathode diameter, thereby defining the cathode step, where the first cathode diameter and second cathode diameter are concentric or axially offset by a predetermined distance.

In accordance with yet another example aspect, a cathode assembly for an ion source is provided. The cathode assembly, for example, comprises a stepped cathode and a stepped cathode shield radially surrounding the stepped cathode while maintaining a gap between the stepped cathode and stepped cathode shield. An interior surface of the stepped cathode shield, for example, generally conforms to an exterior surface of the stepped cathode, therein defining a tortured path between the stepped cathode and stepped cathode shield. The stepped cathode, for example, can comprise a plurality of cathode steps defined in the exterior surface of the stepped cathode, wherein the stepped cathode shield further comprises a plurality of shield steps defined in the interior surface of the stepped cathode shield.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
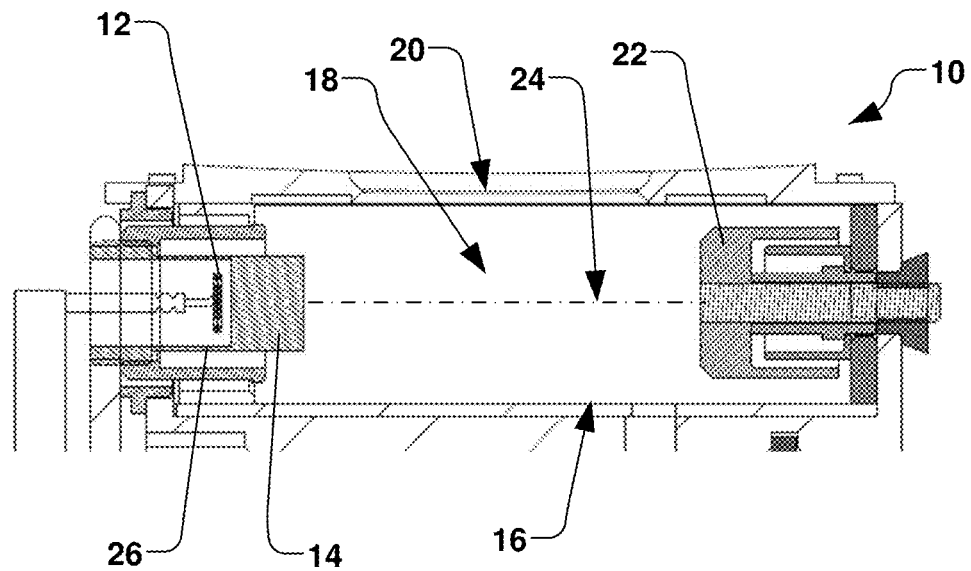
FIG. 1 illustrates a cross-sectional view a conventional ion source having a conventional indirectly heated cathode.
Figure 2:
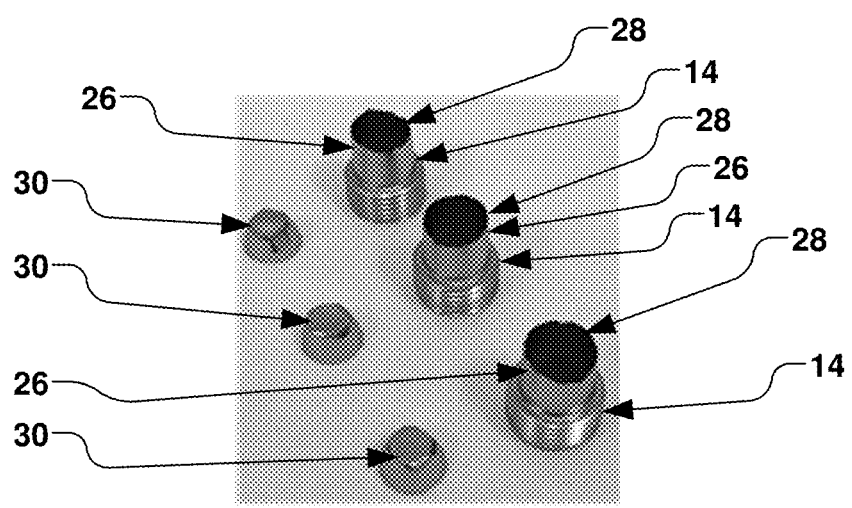
FIG. 2 illustrates three conventional cathodes in a failed state.

The present disclosure is directed generally toward an ion implantation system and an ion source associated therewith. More particularly, the present disclosure provides a configuration and shaping of the cathode and cathode shield in a predetermined manner in order to protect such weak points described above, and to significantly delay cathode wall punch-through. Accordingly, in some cases, the present disclosure can provide a two-fold increase in a lifetime of an ion source incorporating the cathode of the present disclosure. In addition, the present disclosure improves multi-charge ion production for subsequent acceleration for high energy implantation. Thus, the present disclosure is directed generally toward an ion implantation system and an ion source associated therewith. More particularly, the present disclosure is directed toward components for said ion implantation system that improve a lifetime, stability, and operation of the ion implantation system.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, elements or other physical or functional units shown in the drawings or described herein could also be implemented by an indirect connection or coupling. Furthermore, it is to be appreciated that functional blocks or units shown in the drawings may be implemented as separate features in one embodiment, and may also or alternatively be fully or partially implemented in a common feature in another embodiment.

Ion implantation is a process that is employed in semiconductor device fabrication in which ions of one or more elements are accelerated into a workpiece in order to change the properties of the workpiece. For example, it is common for dopants such as boron, arsenic, and phosphorus to be implanted into silicon to modify its electrical properties. In an exemplary ion implantation process, an element or molecule of interest is ionized, extracted, and accelerated electrostatically to form a high energy ion beam, filtered by its mass-to-charge ratio, and directed to strike a workpiece. The ions physically bombard the wafer, enter the surface and come to rest below the surface, at a depth related to their energy.

Figure 3:
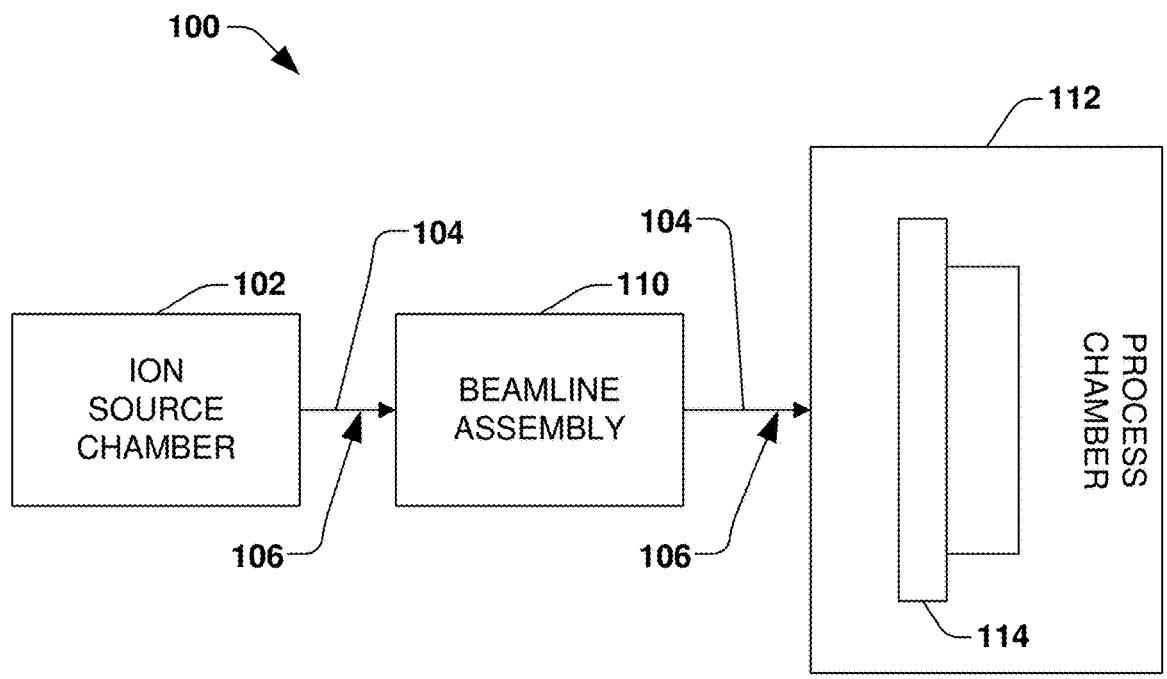
FIG. 3 is a block diagram of an example vacuum system utilizing an ion source in accordance with several aspects of the present disclosure.

Referring now to the Figures, FIG. 3 illustrates a system 100 that includes an ion source 102 for producing an ion beam 104 along a beam path 106. A beamline assembly 110 is provided downstream of the ion source 102 to receive a beam therefrom. The beamline system 110 may include (not shown) a mass analyzer, an acceleration structure, which may include, for example, one or more gaps, and an angular energy filter. The mass analyzer includes a field generating component, such as a magnet, and operates to provide a field across the beam path 106 so as to deflect ions from the ion beam 104 at varying trajectories according to mass (e.g., mass-to-charge ratio). Ions traveling through the magnetic field experience a force which directs individual ions of a desired mass along the beam path 106 and which deflects ions of undesired mass away from the beam path.

A process chamber 112 is provided in the system 100, which contains a target location that receives the ion beam 104 from the beam line assembly 110 and supports one or more workpieces 114 such as semiconductor wafers along the beam path 106 for implantation using the final mass analyzed ion beam. The process chamber 112 then receives the ion beam 104 which is directed toward a workpiece 114. It is appreciated that different types of process chambers 112 may be employed in the system 100. For example, a "batch" type process chamber 112 can simultaneously support multiple workpieces 114 on a rotating support structure, wherein the workpieces 114 are rotated through the path of the ion beam 104 until all the workpieces 114 are completely implanted. A "serial" type process chamber 112, on the other hand, supports a single workpiece 114 along the beam path 106 for implantation, wherein multiple workpieces 114 are implanted one at a time in serial fashion, with each workpiece being completely implanted before implantation of the next workpiece begins. The system 100 may also include a scanning apparatus (not shown) for moving the ion beam 104 with respect to the workpiece 114, or the workpiece with respect to the ion beam.

The ion source 102, for example, generates the ion beam 104 by ionizing a source gas containing a desired dopant element within the ion source. The ionized source gas is subsequently extracted from the source chamber 102 in the form of the ion beam 104. The ionization process is effected by an exciter which may take the form of a thermally heated filament, a filament heating a cathode (indirectly heated cathode "IHC"), or a radio frequency (RF) antenna.

Figure 4:
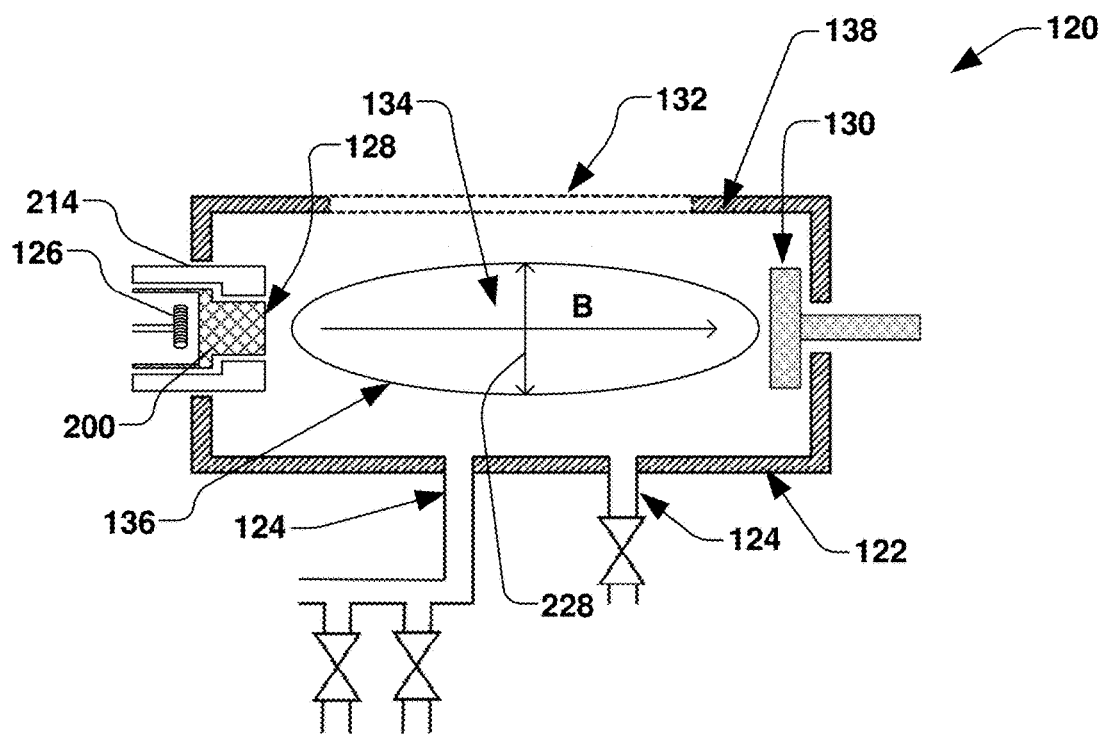
FIG. 4 is a schematic view of an example arc chamber in accordance with several aspects of the present disclosure.

An IHC ion source 120 is illustrated schematically in FIG. 4, for example, wherein the IHC ion source comprises a source chamber 122, one or more gas inlets 124, a filament 126, a cathode 128 and a repeller 130 positioned opposite of one another in the source chamber, and an aperture 132 (also called an arc slit). In addition, a source magnet (not illustrated) can provide a magnetic field 134 generally along an axis between the cathode 128 and repeller 130. During operation of the IHC ion source 120, the filament 126 is resistively heated to temperatures high enough to emit electrons, which are in turn accelerated to bombard the cathode 128 which is maintained at a potential that is positive with respect to the filament.

The electron bombardment heats the cathode 128 to temperatures high enough for it to thermally emit electrons into the source chamber 122 which is held at a potential that is positive with respect to the cathode 128 to accelerate the electrons. The magnetic field 134 helps confine the electrons along the field lines between the cathode 128 and repeller 130 along a plasma column 136 in order to reduce the loss of electrons to chamber walls 138 of the source chamber 122. The loss of electrons is further reduced by the repeller 130 which is typically at the potential of the cathode 128 to reflect electrons back toward the cathode. The excited electrons ionize a source gas which is fed into the chamber through the gas inlet 124, generating a plasma. Ions are extracted through the aperture 132 and electrostatically accelerated to form a high energy ion beam by an electrode positioned outside the source chamber 122.

Figure 5:
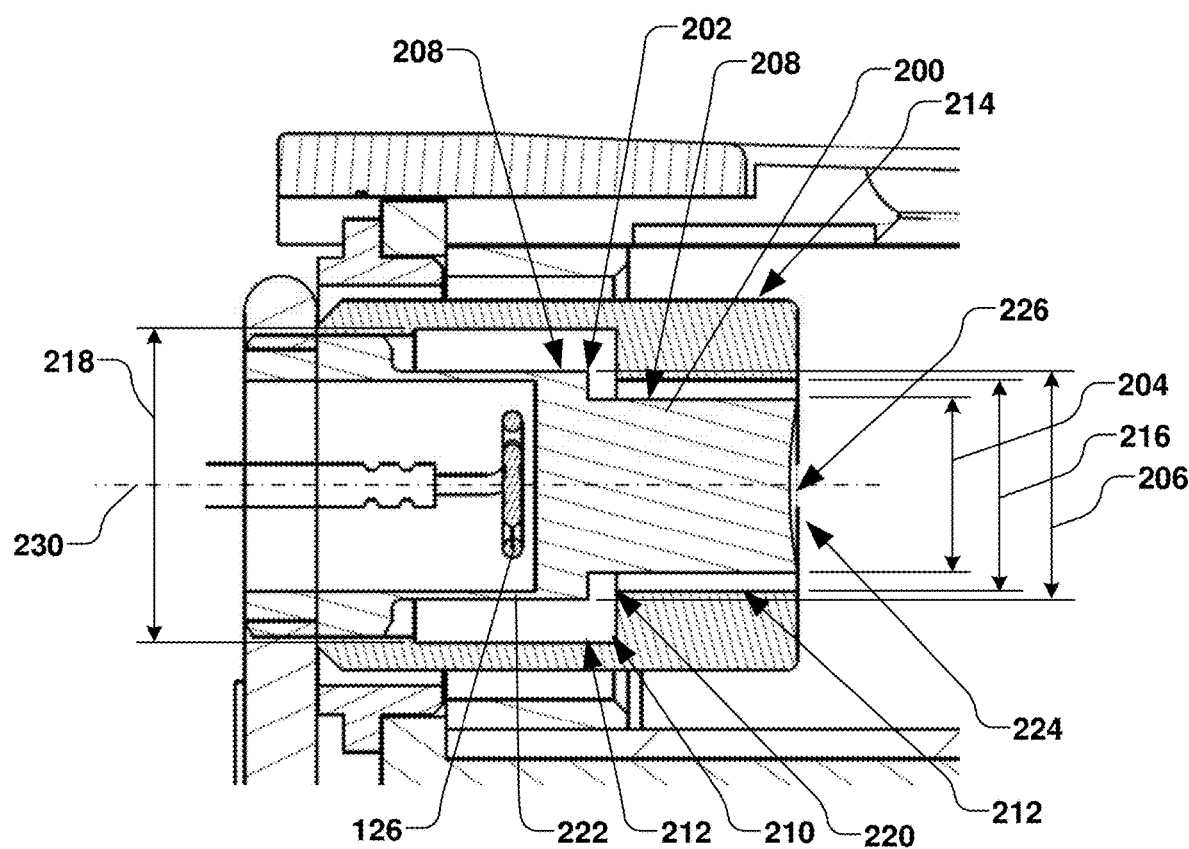
FIG. 5 is a cross-sectional view of an example stepped cathode and stepped cathode shield associated with an ion source chamber in accordance with various aspects of the present disclosure.

In accordance with various example aspects of the present disclosure, FIG. 5 illustrates one example of the present disclosure, wherein a stepped cathode 200 is provided. As shown in FIG. 5, the stepped cathode 200 comprises a cathode step 202 generally defined by a first cathode diameter 204 and a second cathode diameter 206 of an exterior cylindrical wall 208 of the stepped cathode. The cathode step 202 in the exterior cylindrical wall 208 of the stepped cathode 200, for example, is associated with a shield step 210 defined in an interior cylindrical wall 212 of a stepped cathode shield 214, whereby a first shield diameter 216 and a second shield diameter 218 are defined. As such, instead of simply surrounding the cathode with a straight shield, as conventionally shown in FIG. 1, the stepped cathode shield 214 of the example shown in FIG. 5 generally conforms to a shape of the stepped cathode 200, whereby the cylindrical wall 208 of the stepped cathode closely conforms to the interior cylindrical wall 212 of the stepped cathode shield. While FIG. 5 illustrates one cathode step 202 defined in the stepped cathode 200, the present disclosure further contemplates various designs to provide a tortured path 220 between the stepped cathode and stepped cathode shield 214. For example, while not shown, a plurality of cathode steps 202 may be provided in the stepped cathode 200, accompanied by a plurality of shield steps 210 (e.g., similar to a staircase) in the stepped cathode shield 214, thus providing the tortured path 220.

Thus, the present disclosure provides various improvements over the prior art. For example, the stepped cathode 200 and stepped cathode shield 214 of the present disclosure generally prevents plasma within the source chamber 122 from reaching a thin portion 222 of the exterior cylindrical wall 208 (e.g., used for limiting heat transfer from the cathode) of the stepped cathode for an extended period. For example, such a design can lead to an up to ten-fold improvement of cathode/source life over that previously measured with As+++ and As++++ using conventional cathodes.

Further, for multi-charge ion production, the plasma column 136 shown in FIG. 4 is radially small, which can lead to improved ionization or in practice higher extracted beam currents of multi-charge ions. The stepped cathode 200 and stepped cathode shield 214 of FIG. 5, for example, further limits the electron emission to a smaller area 224 at a front cathode surface 226 as compared to conventional cathodes, thus causing a smaller radius 228 of the plasma column 136 of FIG. 4, which in-turn leads to higher multi-charge beam currents and throughput of the ion implanter 100 of FIG. 1.

In the example shown in FIG. 5, the first cathode diameter 204 and second cathode diameter 206 of the external cylindrical wall 208 of stepped cathode 200 are concentric about a centerline 230 of the stepped cathode. Similarly, the first cathode shield diameter 216 and second cathode shield diameter 218 of the interior cylindrical wall 212 of stepped cathode shield 214 are concentric about the centerline 230.

Figure 6:
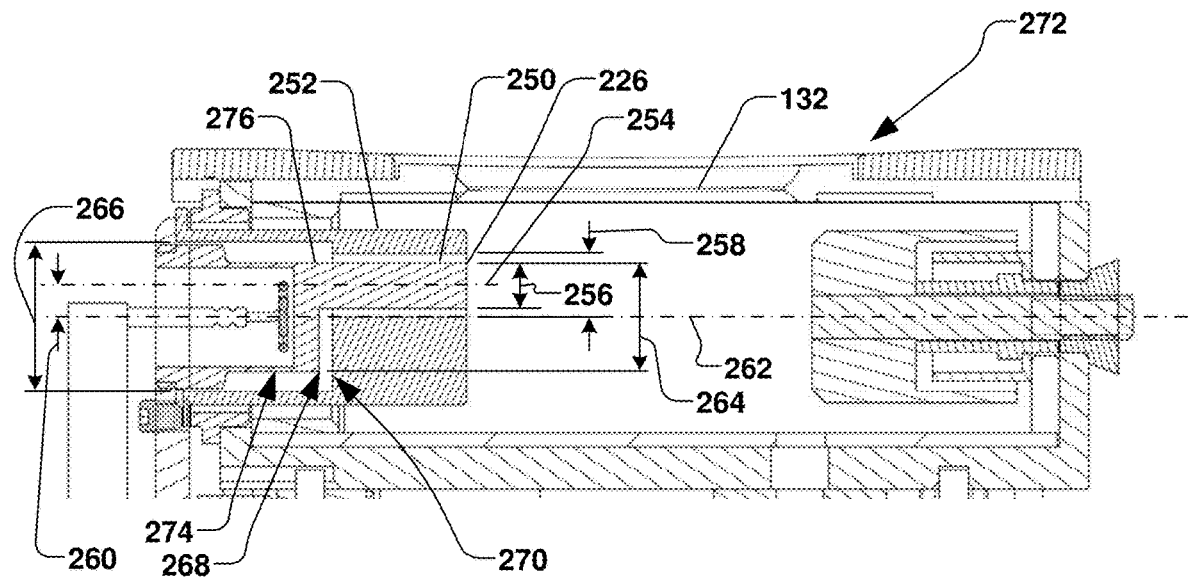
FIG. 6 is a cross-sectional view of an example ion source chamber having an offset stepped cathode in accordance with various aspects of the present disclosure.
Figure 7:
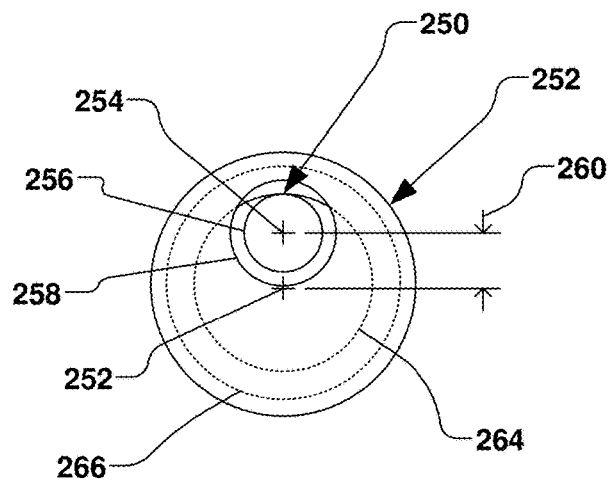
FIG. 7 is a plan view of an example offset stepped cathode in accordance with various aspects of the present disclosure.

In accordance with another example, FIGS. 6-7 illustrate another embodiment, whereby an offset stepped cathode 250 and offset stepped cathode shield 252 are provided having various similarities with the stepped cathode 200 and stepped cathode shield 214 of FIG. 5. However, as illustrated in FIGS. 6-7, a centerline 254 of a first cathode diameter 256 and first shield diameter 258 of the respective offset stepped cathode 250 and offset stepped cathode shield 252 are offset by a predetermined distance 260 from a centerline 262 of a second cathode diameter 264 and second cathode shield diameter 266 of the offset stepped cathode and offset stepped cathode shield. The offset stepped cathode 250 of FIG. 6, for example, can provide the front cathode surface 226 close to the aperture 132, which can further advantageously increase ion beam current over conventional ion sources.

Thus, in a similar manner as discussed above, an offset cathode step 268 defined in the offset stepped cathode 250 and an offset cathode shield step 270 defined in the offset stepped cathode shield 252 likewise substantially prevents plasma within a source chamber 272 (e.g., the source chamber 122 of FIG. 4) from reaching a thin portion 274 of an exterior cylindrical wall 276 shown in FIG. 6 of the offset stepped cathode over an extended period of operation.

Figure 8:
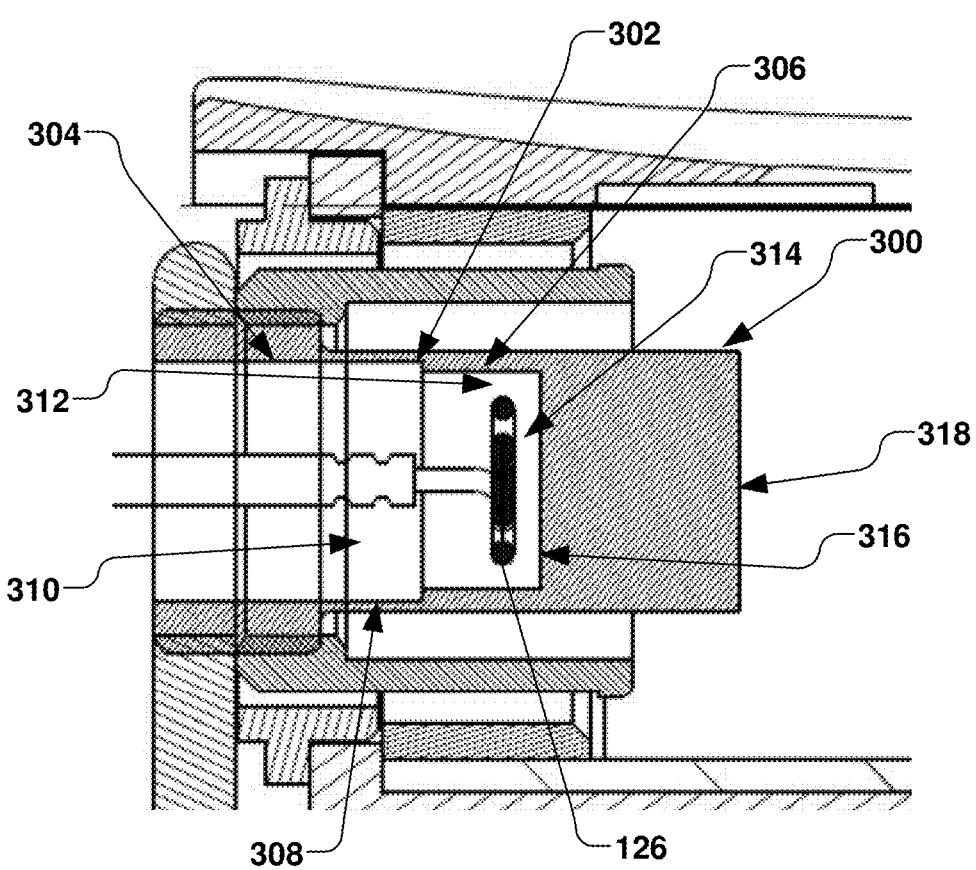
FIG. 8 is a cross-sectional view of an example stepped cathode having an internal step in accordance with various aspects of the present disclosure.

According to another example, FIG. 8 illustrates another stepped cathode 300, wherein the stepped cathode can additionally, or alternatively, comprise an internal step 302 on an inside diameter 304 (e.g., an internal surface), thereof. The punch-through described above, for example, can occur where a thin cathode wall connects to a very thick front portion of a conventional cathode. Accordingly, in the example of the present disclosure that is illustrated in FIG. 8, a thickened wall 306 is provided proximate to the filament 126, thus delaying punch-through in this region and extending cathode life further than that conventionally seen. Providing such an internal step 302 on the inside of the cathode 300, for example, can maintain a thin cathode wall 308 and high thermal resistance in a region 310 further away from the plasma, thus promoting advantageous operation of the ion source. For example, a gap 312 is provided between the filament 126 and the thickened wall 306, wherein the gap, for example, is greater than or approximately equal twice a backside gap 314 between the filament and a backside 316 of the cathode 300. Such a gap 312, for example, enables a front portion 318 of the cathode 300 to heat evenly without tolerance issues of filament placement that could otherwise lead to adverse effects on operation. Further, the present disclosure contemplates sizing a curvature and/or bend radius of the filament 126 to accommodate the internal step 302 and associated gap 312 and backside gap 314.

The present disclosure thus provides improved life of an ion source, such as by factor of up to ten. Further, for multi-charge ions, the present disclosure provides a significantly narrow plasma column, whereby power goes into a smaller volume and this makes the ion source more efficient. The stepped cathode of the present disclosure, for example, provides a smaller diameter of the cathode, thus narrowing the plasma column. Further, the stepped cathode shield, being close in proximity to the stepped cathode and generally conforming in shape to the stepped cathode, generally limits a diffusion of the plasma formed within the ion source from exposure to the thin walls of the stepped cathode through the gap between the stepped cathode shield and the stepped cathode. By providing the aforementioned stepped cathode and stepped cathode shield, a tortured path or labyrinth is provided to generally prevent such plasma diffusion. By providing such a tortured path or labyrinth, while also providing the thin walls of the cathode, primarily only the front plasma-facing portion of the stepped cathode is substantially heated.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion source for forming a plasma, the ion source comprising:
   a cathode comprising:
      a cathode surface defining a cathode step; and
      a cavity;
   a filament disposed within the cavity; and
   a cathode shield having a cathode shield surface at least partially encircling the cathode surface, wherein a cathode gap is defined between the cathode surface and the cathode shield surface.

2. The ion source of claim 1, wherein the cathode surface comprises a stepped cylindrical surface defined by a first cathode diameter and a second cathode diameter, wherein the first cathode diameter and second cathode diameter differ from one another, therein defining the cathode step.

3. The ion source of claim 2, wherein the stepped cylindrical surface comprises an exterior surface defining the first cathode diameter and the second cathode diameter, and wherein the cathode shield surface defines a cathode shield step, wherein a profile of the cathode shield step generally conforms to the cathode step, whereby the cathode gap between the cathode surface and the cathode shield surface is maintained.

4. The ion source of claim 3, wherein the second cathode diameter is greater than the first cathode diameter.

5. The ion source of claim 4, wherein the first cathode diameter and the second cathode diameter are concentric.

6. The ion source of claim 4, wherein the first cathode diameter and the second cathode diameter have respective centerlines that are offset by a predetermined distance.

7. The ion source of claim 3, wherein the cathode gap defines a tortured path.

8. The ion source of claim 2, wherein the stepped cylindrical surface comprises an interior surface defining the first cathode diameter and the second cathode diameter.

9. The ion source of claim 8, wherein the second cathode diameter is greater than the first cathode diameter, thereby defining a thickened wall of the cathode.

10. The ion source of claim 9, wherein a filament gap is defined between the filament and the thickened wall of the cathode.

11. The ion source of claim 1, wherein the cathode comprises a hollow cylindrical portion extending from a solid cylindrical portion at a transition region, wherein the cavity is defined within the hollow cylindrical portion and wherein the cathode step is defined in the transition region.

12. The ion source of claim 11, wherein the cathode shield radially surrounds the cathode while axially exposing a front cathode surface of the cathode to the plasma.

13. An ion source, comprising:
   a cathode having a cathode step defined therein; and
   a cathode shield having a cathode shield step defined therein, wherein the cathode shield radially surrounds the cathode while maintaining a cathode gap between the cathode and cathode shield.

14. The ion source of claim 13, wherein the cathode shield step generally conforms to the cathode step.

15. The ion source of claim 13, wherein the cathode comprises a hollow cylindrical portion extending from a solid cylindrical portion proximate to a transition region, wherein the cathode step is defined in the transition region.

16. The ion source of claim 13, further comprising a filament disposed within a hollow cylindrical portion of the cathode.

17. The ion source of claim 13, wherein the cathode comprises a first cathode diameter and a second cathode diameter, thereby defining the cathode step.

18. The ion source of claim 17, wherein the first cathode diameter and the second cathode diameter are concentric.

19. The ion source of claim 17, wherein the first cathode diameter and the second cathode diameter have centerlines offset by a predetermined distance.

20. A cathode assembly for an ion source, the cathode assembly comprising:
   a stepped cathode; and
   a stepped cathode shield radially surrounding the stepped cathode while maintaining a gap between the stepped cathode and stepped cathode shield, wherein an interior surface of the stepped cathode shield generally conforms to an exterior surface of the stepped cathode, therein defining a tortured path between the stepped cathode and the stepped cathode shield.

21. The cathode assembly of claim 20, wherein the stepped cathode comprises a plurality of cathode steps defined in the exterior surface of the stepped cathode, and wherein the stepped cathode shield comprises a plurality of shield steps defined in the interior surface of the stepped cathode shield.

* * * * *